(12) United States Patent
Chung et al.

(10) Patent No.: US 9,755,109 B2
(45) Date of Patent: Sep. 5, 2017

(54) LIGHT-EMITTING DEVICE

(71) Applicant: EPISTAR CORPORATION, Hsinchu (TW)

(72) Inventors: Chien-Kai Chung, Hsinchu (TW);
Po-Shun Chiu, Hsinchu (TW);
Hsin-Ying Wang, Hsinchu (TW);
De-Shan Kuo, Hsinchu (TW);
Tsun-Kai Ko, Hsinchu (TW); Yu-Ting Huang, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 15/228,529

(22) Filed: Aug. 4, 2016

(65) Prior Publication Data
US 2016/0343909 A1 Nov. 24, 2016

Related U.S. Application Data

(63) Continuation of application No. 14/185,586, filed on Feb. 20, 2014, now Pat. No. 9,412,906.

(51) Int. Cl.
*H01L 33/00* (2010.01)
*H01L 33/22* (2010.01)
*H01L 33/38* (2010.01)
*H01L 33/20* (2010.01)
*H01L 33/14* (2010.01)

(52) U.S. Cl.
CPC .............. *H01L 33/22* (2013.01); *H01L 33/20* (2013.01); *H01L 33/38* (2013.01); *H01L 33/145* (2013.01); *H01L 33/382* (2013.01)

(58) Field of Classification Search
CPC ......... H01L 33/22; H01L 33/20; H01L 33/38; H01L 33/145; H01L 33/382
USPC ........................................................ 257/99
See application file for complete search history.

(56) References Cited

U.S. PATENT DOCUMENTS

| 6,777,805 B2 | 8/2004 | Uemura et al. |
| 9,130,125 B2 | 9/2015 | Hwang et al. |
| 2011/0163346 A1 | 7/2011 | Seo et al. |
| 2011/0272730 A1 | 11/2011 | Bae et al. |
| 2012/0018764 A1 | 1/2012 | Choi et al. |

(Continued)

FOREIGN PATENT DOCUMENTS

| JP | 2008210900 A | 9/2008 |
| JP | 5040355 B2 | 10/2012 |

*Primary Examiner* — Tu-Tu Ho
(74) *Attorney, Agent, or Firm* — Ditthavong & Steiner, P.C.

(57) ABSTRACT

A light-emitting device includes: a light-emitting stack including a first side, a second side opposite to the first side, a third side connecting the first side and the second side, and an upper surface between the first side and the second side; a first electrode pad formed on the upper surface; a second electrode pad formed on the upper surface, wherein the first electrode pad is closer to the first side than the second electrode pad; and a first extension electrode including a first section extended from the first electrode pad in a direction away from the third side, and a second section connecting to the first section and perpendicular to the first side; wherein a distance between the first electrode pad and the third side is smaller than a distance between the second electrode pad and the third side.

19 Claims, 5 Drawing Sheets

(56) References Cited

U.S. PATENT DOCUMENTS

| | | | |
|---|---|---|---|
| 2013/0234192 A1* | 9/2013 | Kim | H01L 33/38 257/98 |
| 2014/0203317 A1* | 7/2014 | Shin | H01L 33/387 257/98 |
| 2014/0231859 A1* | 8/2014 | Kim | H01L 33/38 257/99 |

* cited by examiner

LIGHT-EMITTING DEVICE

REFERENCE TO RELATED APPLICATION

This application is a continuation application of U.S. patent application Ser. No. 14/185,586, filed on Feb. 20, 2014, now granted.

TECHNICAL FIELD

The application relates to a light-emitting device, and more particularly, to a light-emitting device having two electrodes on the same side of a substrate thereof.

DESCRIPTION OF BACKGROUND ART

The lighting theory and structure of light-emitting diode (LED) is different from that of conventional lighting source. An LED has advantages as a low power loss, a long life-time, no need for warming time, and fast responsive time. Moreover, it is small, shockproof, and suitable for mass production. Therefore, LEDs are widely adopted in the market. For example, LEDs can be used in optical display apparatus, laser diodes, traffic lights, data storage devices, communication devices, illumination devices, medical devices, and so on.

A light-emitting device may include a substrate, a light-emitting stack including an n-type semiconductor layer, an active layer, and a p-type semiconductor layer. The light-emitting stack may have a roughened structure on the surface or the substrate thereof to enhance light extraction.

In addition, the light emitting device can be further connected to other components in order to form a light emitting apparatus. The light-emitting device may be mounted onto a submount with the side of the substrate, or a solder bump or a glue material may be formed between the submount and the light-emitting device, therefore a light-emitting apparatus is formed. Besides, the submount further comprises the circuit layout electrically connected to the electrode of the light-emitting device via an electrical conductive structure such as a metal wire.

SUMMARY OF THE APPLICATION

A light-emitting device includes: a light-emitting stack including a first side, a second side opposite to the first side, and an upper surface between the first side and the second side; a first electrode pad formed on the upper surface; a second electrode pad formed on the upper surface, and the first electrode pad is closer to the first side than the second electrode pad; and a first extension electrode including a first section extended from the first electrode pad toward the second electrode pad, and a second section extended from the first electrode pad toward the first side.

A light-emitting device includes: a light-emitting stack including a first side, a second side opposite to the first side, and an upper surface between the first side and the second side; a first electrode pad formed on the upper surface; a second electrode pad formed on the upper surface, and the first electrode pad is closer to the first side than the second electrode pad; and a first extension electrode including a first section extended from the first electrode pad and parallel to the first side, and a second section connected to the first section and perpendicular to the first side.

A light-emitting device includes: a light-emitting stack including a first side, a second side opposite to the first side, a third side connecting the first side and the second side, and an upper surface between the first side and the second side; a first electrode pad formed on the upper surface; a second electrode pad formed on the upper surface, wherein the first electrode pad is closer to the first side than the second electrode pad; and a first extension electrode including a first section extended from the first electrode pad in a direction away from the third side, and a second section connecting to the first section and perpendicular to the first side; wherein a distance between the first electrode pad and the third side is smaller than a distance between the second electrode pad and the third side.

DETAILED DESCRIPTION OF PREFERRED EMBODIMENTS

Figure 1A:
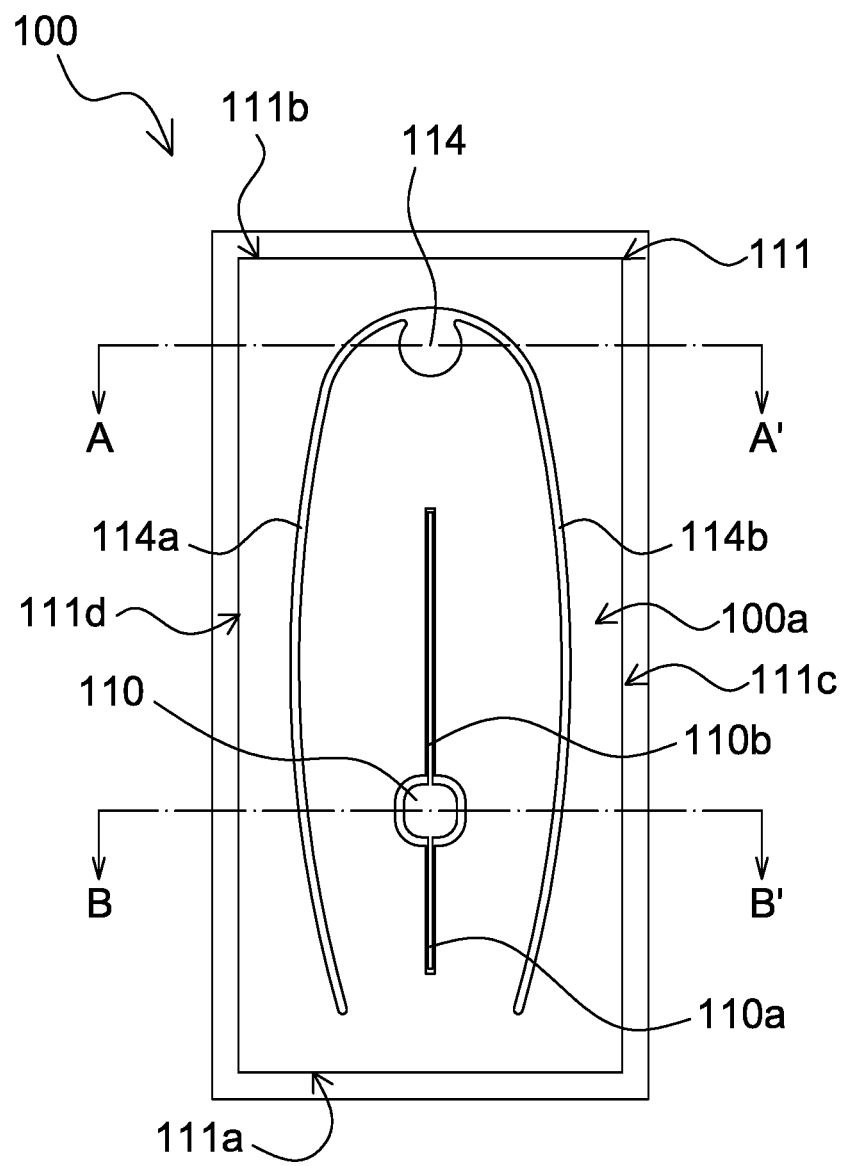
FIGS. 1A to 1C illustrate a light-emitting device in accordance with a first embodiment of the present application.
Figure 1B:
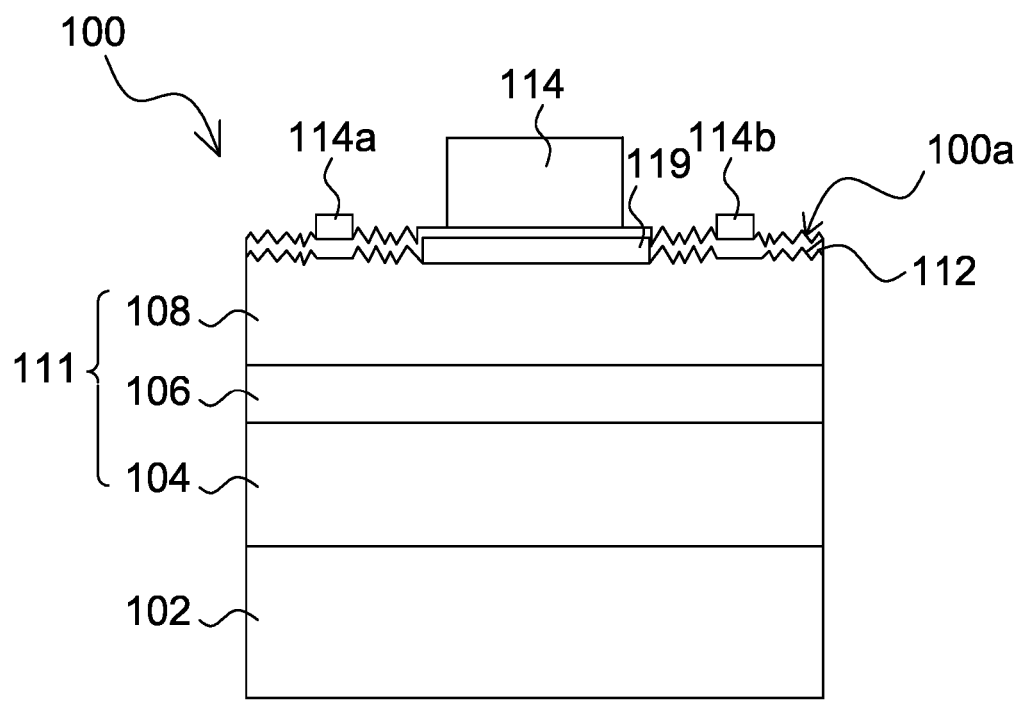
Figure 1C:
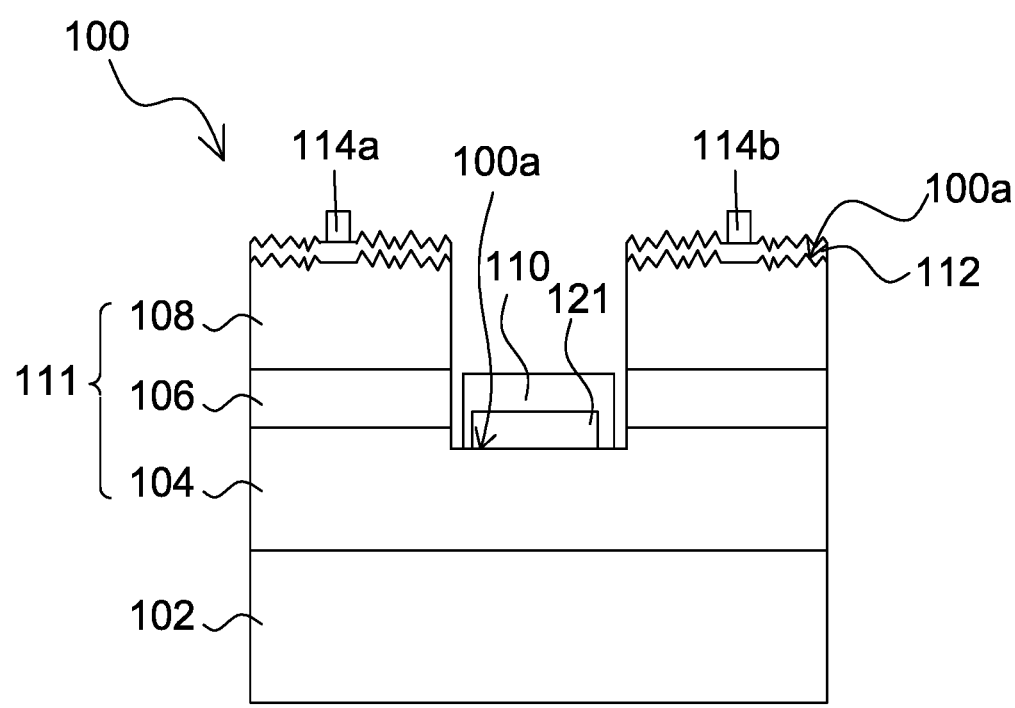

Referring to FIGS. 1A to 1C, a light-emitting device in accordance with a first embodiment of the present application is disclosed, wherein FIG. 1B is a cross-sectional view of FIG. 1A along line AA', and FIG. 1C is a cross-sectional view of FIG. 1A along line BB'. The light-emitting device 100 comprises: a light-emitting stack 111 comprising a first side 111a, a second side 111b opposite to the first side 111a, and an upper surface 100a between the first side 111a and the second side 111b; a first electrode pad 110 formed on the upper surface 100a; a second electrode pad 114 formed on the upper surface 100a, and the first electrode pad 110 is closer to the first side 111a than the second electrode pad 114; and a first extension electrode comprising a first section 110b extended from the first electrode pad 110 toward the second electrode pad 114, and a second section 110a extended from the first electrode pad 110 toward the first side 111a. The light-emitting stack 111 further comprises a third side 111c and a fourth side 111d opposite to the third side 111c, and the first side 111a, the second side 111b, the third side 111c and the fourth side 111d form a rectangle, and the first side 111a and second side 111b are the shorter sides, and the third side 111c and the fourth side 111d are the longer sides. The first electrode pad 110 and the second electrode pad 114 can be aligned to each other in accordance with a straight line (not shown) perpendicular to the first side 111a and the second side 111b, and the first section 110b and the second section 110a are in stripe form and formed along the straight line. The length of the first side 111a (or second side 111b) and the third side 111c can be represented by X and Y, respectively. The length of the first section 110b and second section 110a can be represented by a and b, respectively. The optimized design of the light-emitting device 100 can be in accordance with a formula: $(a/b)=C(Y/X)-L$, wherein C can be a value between 1.5 and 2, and L can be a value between 1 and 1.05 for adjusting the ratio of a/b when X and Y are predetermined. The light-emitting stack 111 can comprise a lower semiconductor layer 104, an active layer 106 and an upper semiconductor layer 108. The lower semiconductor layer 104 can comprise n type, and the upper semiconductor layer can comprise p type, and the active layer 106 can be configured as a single heterostructure (SH), a double heterostructure (DH), a double-side double heterostructure (DDH), or a multi-quantum well (MQW) structure. The first electrode pad 110 is formed on a mesa of the lower semiconductor layer 104 by removing a portion of the upper semiconductor layer 108 and the active layer 106, and the second electrode pad 114 is formed on the upper semiconductor layer 108. The horizontal distance between the first electrode pad 110 and the second electrode pad 114 affects the output optical power and the forward voltage of the light-emitting device 100 which has a rectangle shape. Compared with the conventional light-emitting device, the first electrode pad 110 in the embodiment is located at a position closer to the second electrode pad 114, therefore a current for activating the light-emitting device can reach the first electrode pad 110 more easily, and the second section 110a can also help to spread the current to the area between the first electrode pad 110 and the first side 111a. In the present embodiment, the forward voltage of the light-emitting stack 111 can be between 3.05 V and 3.11V.

A second extension electrode comprising a first branch 114a and a second branch 114b can be extended from the second electrode pad 114. The first section 110b can be positioned between the first branch 114a and the second branch 114b, and in the present embodiment, the first electrode pad 110 and the second section 110a are also positioned between the first branch 114a and the second branch 114b. The ends of the first branch 114a and the second branch 114b can be closer to the first side 111a than the end of the second section 110a.

A portion of the upper surface 100a that exposes the upper semiconductor layer 108 can be uneven, and a transparent conductive layer 112 can be conformably formed on the upper semiconductor layer 108. The transparent conductive layer 112 can be ITO, AZO, IZO, ZnO or other oxide material. A first current blocking layer 119 can be formed under the second electrode pad 114. The first current blocking layer 119 can be directly formed on a smoothing portion of the upper semiconductor layer 108, and the transparent conductive layer 112 can be formed between the second electrode pad 114 and the first current blocking layer 119. A second current blocking layer 121 can be formed under the first electrode pad 110, and in the first embodiment the second current blocking layer 121 is embedded in the first electrode pad 110 and has a side in contact with the lower semiconductor layer 104.

The light-emitting stack 111 can be formed on a substrate 102, and in the embodiment the substrate 102 is sapphire, and the light-emitting stack 111 comprises nitride-based material grown from the substrate 102 by epitaxial growth. However an adhesive layer (not shown) can be formed between the light-emitting stack 111 and the substrate 102 for attaching the light-emitting stack 111 on the substrate 102, and the light-emitting stack 111 can comprise AlGaInP-based material or nitride-based material, and the substrate 102 comprises insulating substrate such as sapphire or heat-dissipation substrate such as ceramic or metal.

Figure 2A:
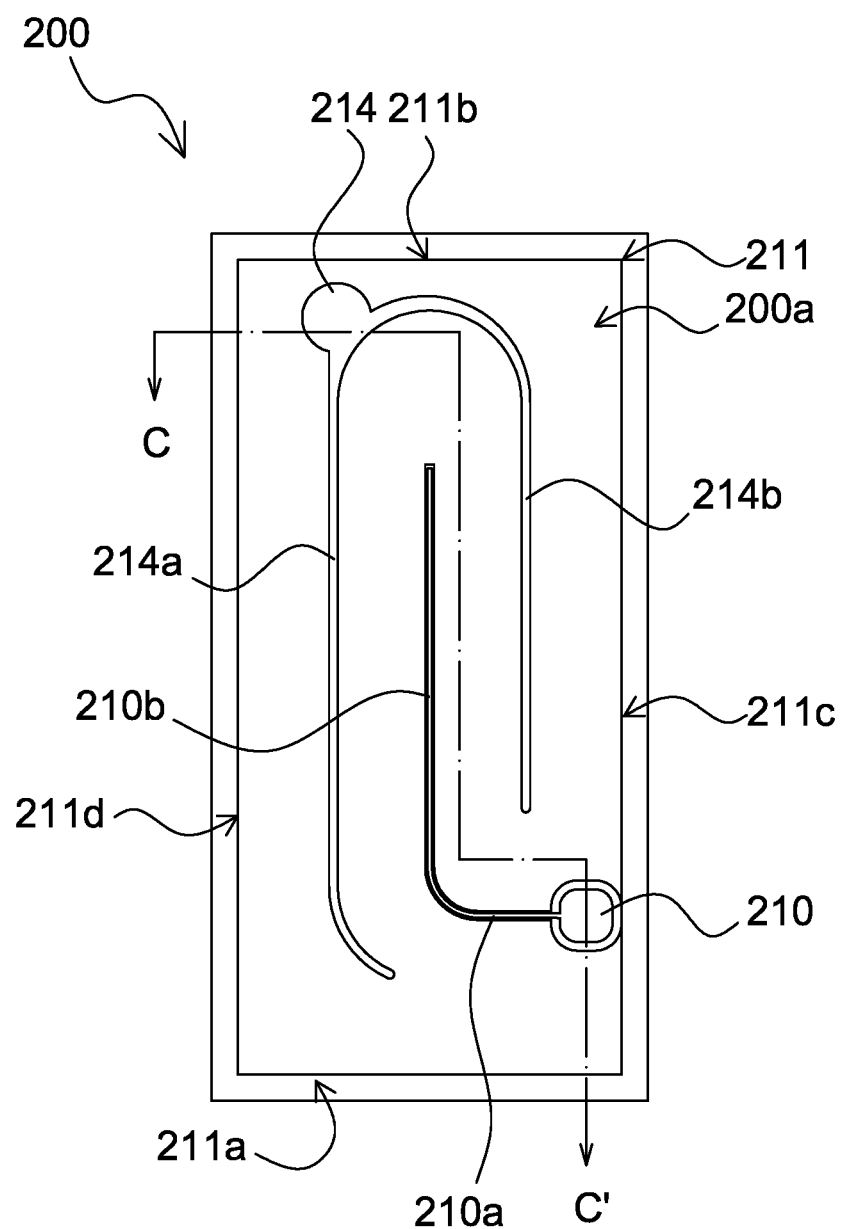
FIGS. 2A to 2B illustrates a light-emitting device in accordance with a second embodiment of the present application.
Figure 2B:
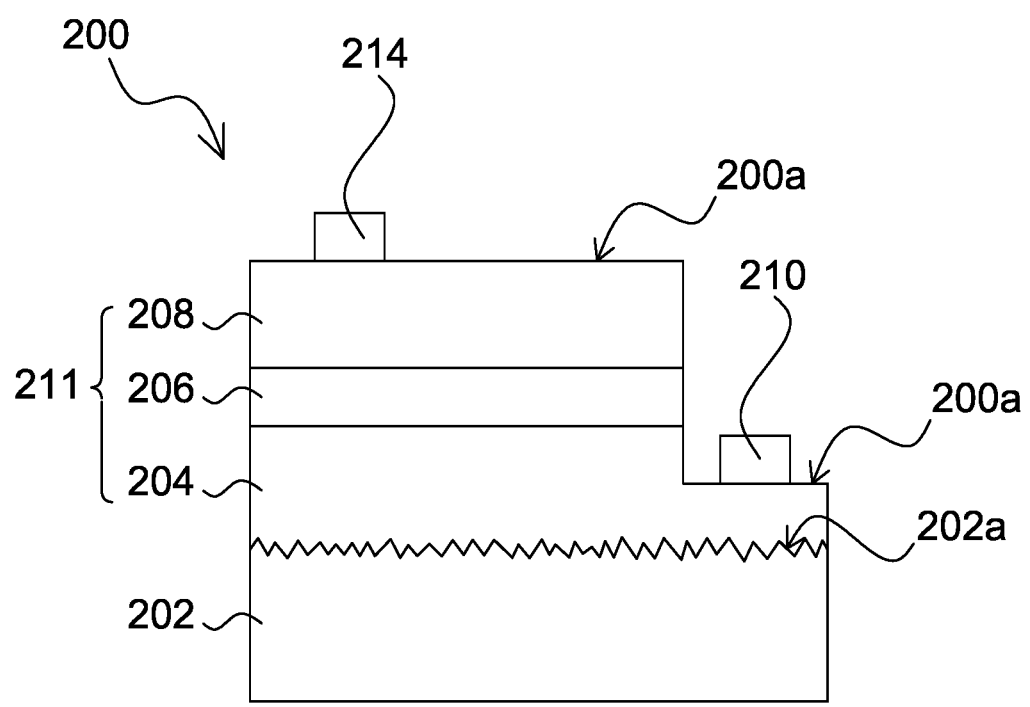

Referring to FIGS. 2A and 2B, a light-emitting device in accordance with a second embodiment of the present application is disclosed, wherein FIG. 2B is a cross-sectional view of FIG. 2A along line CC'. A light-emitting device 200 comprises: a light-emitting stack 211 comprising a first side 211a, a second side 211b opposite to the first side 211a, and an upper surface 200a between the first side 211a and the second side 211b; a first electrode pad 210 formed on the upper surface 200a; a second electrode pad 214 formed on the upper surface 200a, and the first electrode pad 210 is closer to the first side 211a than the second electrode pad 214; and a first extension electrode comprising a first section 210a extended from the first electrode pad 210 and parallel to the first side 211a, and a second section 210b connected to the first section 210a and perpendicular to the first side 211a or the second side 211b. The second section 210b can be bended from the first section 210a and has an end directing to the second side 211b. The light-emitting stack 211 further comprises a third side 211c and a fourth side 211d opposite to the third side 211c, and the first side 211a, the second side 211b, the third side 211c and the fourth side 211d form a rectangle, wherein the first side 211a and second side 211b are the shorter sides, and the third side 211c and the fourth side 211d are the longer sides. The first electrode pad 210 can be adjacent to the third side 211c, and the second electrode pad 214 can be located near the corner between the second side 211b and the fourth side 211d. The light-emitting device 200 can further comprise a second extension electrode comprising a first branch 214a and a second branch 214b respectively extended from the second electrode pad 214, and the second section 210b is between the first branch 214a and the second branch 214b. The first branch 214a is a stripe parallel to the fourth side 211d and is bended near the end thereof, and the end approximately directs towards the corner between the first side 211a and the third side 211c. The second branch 214b can be initially an arc toward the second side 211b and the third side 211c, and then extended toward the first side 211a with a stripe parallel to the third side 211c.

A substrate 202 having an uneven upper surface 202a is for supporting the light-emitting stack 211, and similar to the first embodiment, the light-emitting stack 211 can be formed on the substrate 202 by epitaxial growth or adhesive attaching.

Figure 3:
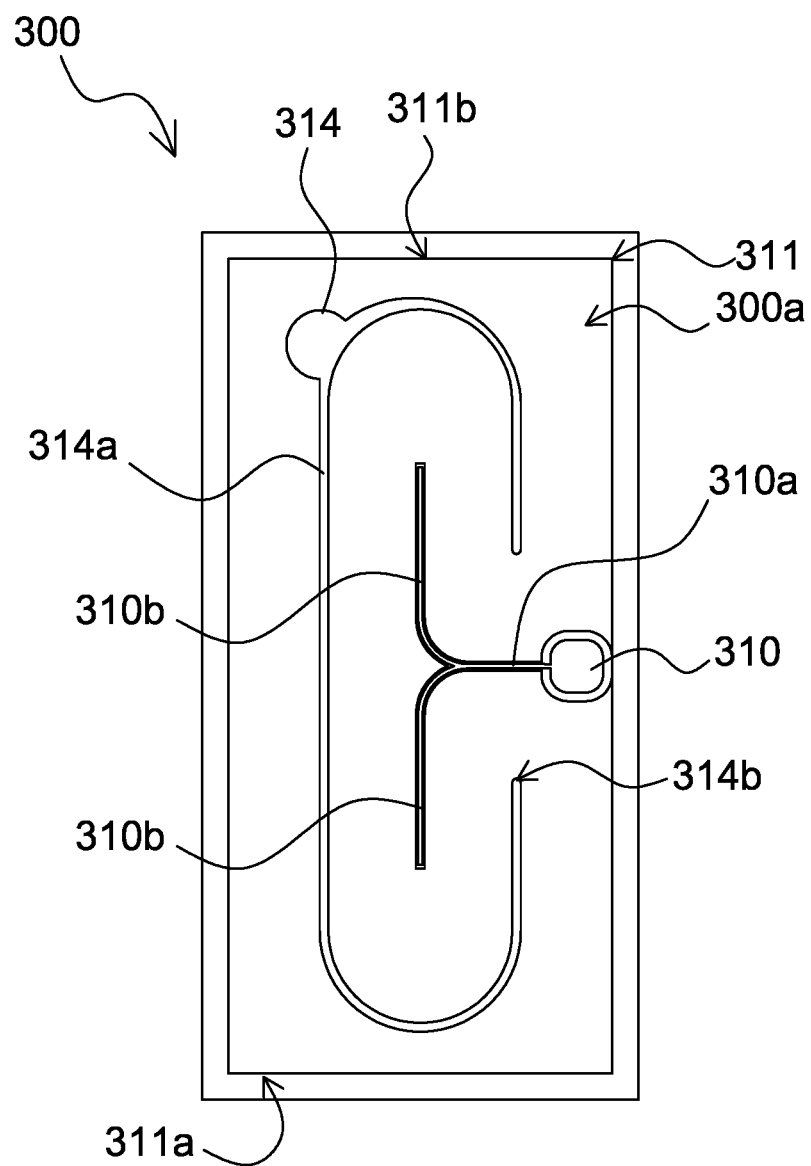
FIG. 3 illustrates a light-emitting device in accordance with a third embodiment of the present application.

Referring to FIG. 3, a light-emitting device in accordance with a third embodiment of the present application is disclosed. A light-emitting device 300 comprises: a light-emitting stack 311 comprising a first side 311a, a second side 311b opposite to the first side 311a, and an upper surface 300a between the first side 311a and the second side 311b; a first electrode pad 310 formed on the upper surface 300a; a second electrode pad 314 formed on the upper surface 300a, and the first electrode pad 310 is closer to the first side 311a than the second electrode pad 314; and a first extension electrode comprising a first section 310a extended from the first electrode pad 310 and parallel to the first side 311a, and a second section 310b connected to the first section 310a and perpendicular to the first side 311a or the second side 311b. The difference between the third embodiment and the second embodiment is that the second section 310b has two ends toward the first side 311a and the second side 311b, respectively, and a distance between the first electrode pad 310 and the first side 311a is approximately the same with a distance between the first electrode pad 310 and the second side 311b. A branch 314a can be extended from the second electrode pad 314 and has a pattern surrounding the second section 310b, and the branch 314a has an opening 314b for accommodating the first section 310a.

The principle and the efficiency of the present application illustrated by the embodiments above are not the limitation of the application. Any person having ordinary skill in the art can modify or change the aforementioned embodiments. Therefore, the protection range of the rights in the application will be listed as the following claims.

What is claimed is:

1. A light-emitting device, comprising:
a light-emitting stack comprising a first side, a second side opposite to the first side, and a third side connected to the first side and the second side;
a first electrode pad formed on the light-emitting stack;
a second electrode pad formed on the light-emitting stack, wherein the first electrode pad is closer to the first side than the second electrode pad;
a first extension electrode comprising a first section extended from the first electrode pad in a direction away from the third side, and a second section connected to the first section; and
a second extension electrode comprising a first branch and a second branch respectively extended from the second electrode pad;
wherein a distance between the first electrode pad and the third side is smaller than a distance between the second electrode pad and the third side;
wherein the second section comprises two ends toward the first side and the second side, respectively, and the two ends of the second section is between the first branch and the second branch.

2. The light-emitting device of claim 1, wherein the first section is parallel to the first side.

3. The light-emitting device of claim 1, wherein the first electrode pad is adjacent to the third side between the first side and the second side of the light-emitting stack.

4. The light-emitting device of claim 1, wherein the first branch and the second branch are asymmetrical.

5. The light-emitting device of claim 1 wherein the two ends of the second section are aligned to each other in accordance with a line perpendicular to the first side.

6. The light-emitting device of claim 1 wherein the second section comprises a symmetrical shape.

7. The light-emitting device of claim 1, wherein the first branch surrounds the second section.

8. The light-emitting device of claim 1, further comprising a substrate configured to support the light-emitting stack, wherein the substrate comprises an uneven surface facing the light-emitting stack.

9. The light-emitting device of claim 1, wherein the light-emitting stack comprises a fourth side opposite to the third side, and the first side, the second side, the third side and the fourth side form a rectangle.

10. The light-emitting device of claim 9, wherein the first branch comprises a third section parallel to the third side and a fourth section connected to the third section and toward the first side.

11. A light-emitting device, comprising:
a light-emitting stack comprising a first side, a second side opposite to the first side, a third side connected to the first side and the second side, and a fourth side opposite to the third side, wherein the first side and the second side are shorter than the third side and the fourth side;
a first electrode pad formed on the light-emitting stack;
a second electrode pad formed on the light-emitting stack; and
a first extension electrode comprising a first section extended from the first electrode pad in a direction away from the third side, and a second section connected to the first section and extended to the second side;
wherein a distance between the first electrode pad and the third side is smaller than a distance between the second electrode pad and the third side.

12. The light-emitting device of claim 11, further comprising a second extension electrode comprising a first branch and a second branch respectively extended from the second electrode pad.

13. The light-emitting device of claim 12, wherein the first branch and the second branch are asymmetrical.

14. A light-emitting device, comprising:
a light-emitting stack comprising an lower semiconductor layer comprising a first portion and a second portion, an active layer disposed on the first portion of the lower semiconductor layer, and an upper semiconductor layer disposed on the active layer, wherein the second portion is exposed by the active layer, wherein the light-emitting stack comprises a first side, a second side opposite to the first side, a third side connected to the first side and the second side, and a fourth side opposite to the third side;
a first electrode pad disposed on the second portion of the lower semiconductor layer and adjacent to the third side;
a second electrode pad disposed on the upper semiconductor layer; and
a first extension electrode comprising a first section extended from the first electrode pad in a direction away from the third side, and a second section connected to the first section and extended to the second side;
wherein a distance between the first electrode pad and the third side is smaller than a distance between the second electrode pad and the fourth side.

15. The light-emitting device of claim 14, further comprising a second extension electrode comprising a first branch and a second branch respectively extended from the second electrode pad.

16. The light-emitting device of claim 15, wherein the first branch and the second branch are asymmetrical.

17. The light-emitting device of claim 16, wherein the second section is disposed between the first branch and the second branch.

18. The light-emitting device of claim 14, wherein the first side or the second side are shorter than the third side or the fourth side.

19. The light-emitting device of claim 14, wherein a distance between the first electrode pad and the third side is smaller than a distance between the second electrode pad and the third side.

* * * * *